United States Patent [19]

Stevens et al.

[11] Patent Number: 5,132,278

[45] Date of Patent: Jul. 21, 1992

[54] SUPERCONDUCTING COMPOSITE ARTICLE, AND METHOD OF MAKING THE SAME

[75] Inventors: Ward C. Stevens, New Fairfield, Conn.; David S. Kurtz, Brewster, N.Y.

[73] Assignee: Advanced Technology Materials, Inc., Danbury, Conn.

[21] Appl. No.: 523,056

[22] Filed: May 11, 1990

[51] Int. Cl.$^5$ ........................................... H01B 12/10

[52] U.S. Cl. .................................... 505/1; 428/614; 428/632; 428/930; 505/701; 505/704

[58] Field of Search ............... 428/614, 930, 632; 505/1, 701, 704

[56] References Cited

U.S. PATENT DOCUMENTS

| | | | |
|---|---|---|---|
| 4,079,187 | 3/1978 | Fillunger et al. | 174/15 S |
| 4,377,032 | 3/1983 | Benz | 29/599 |
| 4,489,219 | 12/1984 | Suenaga et al. | 174/128 S |
| 4,529,837 | 7/1985 | Borden | 174/128 S |
| 4,804,649 | 2/1989 | Sherif | 505/1 |
| 4,845,308 | 7/1989 | Womack, Jr. et al. | 174/15.4 |
| 4,857,675 | 8/1989 | Marancik et al. | 174/15.4 |
| 4,860,431 | 8/1989 | Marancik et al. | 29/599 |
| 4,929,596 | 5/1990 | Meyer et al. | 505/1 |
| 4,952,554 | 8/1990 | Jin et al. | 505/1 |
| 4,954,479 | 9/1990 | Dubots et al. | 505/1 |
| 4,959,279 | 9/1990 | Tanaka et al. | 428/660 |
| 4,959,346 | 9/1990 | Campero et al. | 505/1 |
| 4,965,245 | 10/1990 | Sugimoto et al. | 505/1 |
| 4,965,249 | 10/1990 | DeWith et al. | 505/1 |
| 4,970,197 | 11/1990 | Shiota et al. | 505/1 |
| 4,980,964 | 1/1991 | Boeke | 59/599 |
| 4,983,574 | 1/1991 | Meyer | 505/1 |
| 4,983,576 | 1/1991 | Hagino | 505/1 |
| 4,990,490 | 2/1991 | Pathare et al. | 505/1 |
| 4,990,492 | 2/1991 | Creedon et al. | 505/701 |
| 4,994,435 | 1/1991 | Shiga et al. | 505/1 |
| 5,017,553 | 5/1991 | Whitlow et al. | 505/1 |

FOREIGN PATENT DOCUMENTS

| | | | |
|---|---|---|---|
| 3915403 | 11/1989 | Fed. Rep. of Germany | 505/704 |
| 2-183915 | 7/1990 | Japan | 505/704 |
| 12307 | 12/1989 | World Int. Prop. O. | 505/704 |

OTHER PUBLICATIONS

Keim, T. A., "A Few Comments on Superconducting AC Electric Machines", Extend Abstracts High Temperature Superconductors I, 1988, pp. 147-149.

Ledbetter, H. M., et al., "Elastic Constants and Debye Temperature of Polycrystalline $Y_1Ba_2CuO_{7-x}$", J. Mater. Res., 1987, vol. 2, pp. 788-789.

Chien, C. L., et al., "Effect of Noble Metal Buffer Layers on Superconducting $YBa_2Cu_3O_7$ Thin Films", Appl. Phys. Lett., 1987, vol. 51, pp. 2155-2157.

Sleigh, A. W., et al., "High $T_c$ Bismuth and Thallium Copper Oxide Superconductors" MRS Bulletin, Jan. 1989, pp. 45-48.

Maple, M. B., "High $T_c$ Oxide Superconductors", MRS Bulletin, Jan. 1989, pp. 20-21.

Ledbetter, H. M., "Elastic Properties of Metal-Oxide Superconductors", Journal of Metals, Jan. 1988, pp. 24-30.

Primary Examiner—R. Dean
Assistant Examiner—George Wyszomierski
Attorney, Agent, or Firm—Steven J. Hultquist

[57] ABSTRACT

A superconducting composite material comprising a superconducting element, coated on its exterior surface with noble or inert metal, in a conductive metal matrix which includes nonsuperconducting fibers. The superconducting element may suitably comprise a filament of 123 metal oxide high temperature superconductor (MOHTSC) material, or other metal oxide superconductive material. The composite structure of the invention overcomes the inherent brittleness of metal oxide-type superconductive materials and the sensitivity to flaws to which MOHTSC materials are suceptible. The noble or inert metal and conductive matrix metal may suitably be applied by MOCVD techniques. A preferred form of the superconducting article of the present invention is a tape comprising a generally planar array of superconductive filaments, for applications such as energy storage devices, power transmission and propulsion systems that require large magnetic fields, transformers, motors, and generators. Also disclosed are a method and apparatus for applying a liquid organometallic compound in atomized form to a substrate which is heated to sufficient temperature to decompose the applied organometallic compound and yield a film of deposited metal on the substrate.

25 Claims, 8 Drawing Sheets

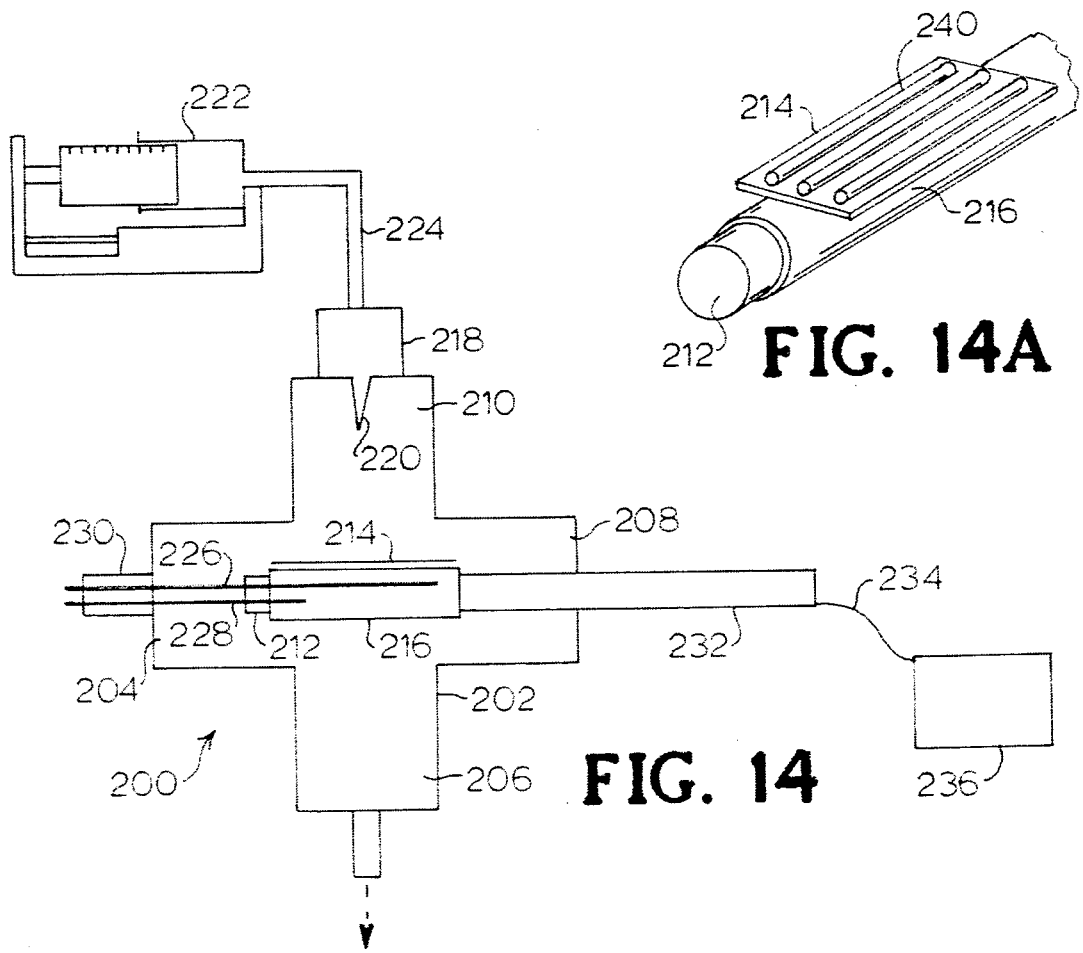
FIG. 14A
FIG. 14
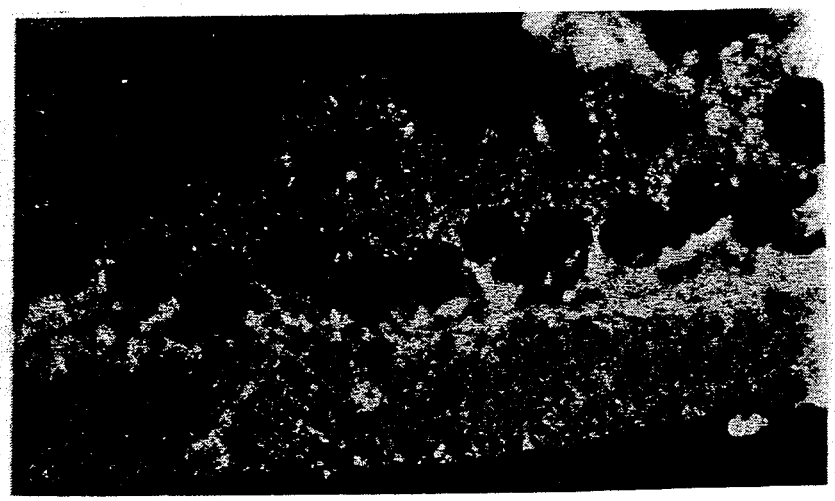
FIG. 15

SUPERCONDUCTING COMPOSITE ARTICLE, AND METHOD OF MAKING THE SAME

BACKGROUND OF THE INVENTION

1. Field of The Invention

This invention relates to composite articles comprising metal oxide superconducting elements, and to a method of making such composite articles.

2. Description of The Related Art

A primary deficiency of metal oxide high temperature superconductor (MOHTSC) materials developed to date, particularly in large scale applications such as power transmission lines, generators, superconducting magnets, and motors, is that such oxide materials are, as ceramics, extremely brittle and highly sensitive to flaws. Any point stresses or defects in these materials cause local stress concentrations and provide a mode of mechanical failure which is at odds with the mechanical reliability necessary in such applications.

As a result of such intrinsic brittleness and susceptibility to point stresses and structural defects, MOHTSC materials are ill suited to use in applications such as motor coils and magnets, in which elements constructed of MOHTSC materials must withstand considerable stress, under complex modes of operation, without failure. As an example, it has been estimated that strains of several tenths of one percent will have to be accommodated in superconducting alternating current electric machines, as reported in Keim, T. A., "Extended Abstracts High Temperature Superconductors I," 1988, page 147. Based on elastic constants which have been reported (Leadbetter, H. M., et al, *J. Mater. Res.*, 1987, Vol. 2, page 786; Leadbetter, H. M., *J. Met.*, 1988, Vol. 40, No. 1, page 24) which have been reported for the so-called "123" MOHTSC materials (of the general formula $YBa_2Cu_3O_x$, where x is from about 6 to about 7.1), superconducting wires with at least 50 ksi tensile strength would be required for large generator applications. In other applications such as transformers, motors, and small generators, and even in small-scale applications such as SQUID magnetometers and digital electronic components based on Josephson Junction Devices, physical properties requirements for the MOHTSC materials are less severe, but strength and mechanical reliability remain important considerations constraining the use of MOHTSC materials.

A further applications-related problem facing the implementation of MOHTSC materials is that environmental conditions which deplete oxygen from the MOHTSC material, e.g, high temperature exposure, can significantly adversely affect the superconducting properties (e.g., residual resistivity) of these oxide materials. For example, high temperature exposure can deplete MOHTSC materials of oxygen, with consequent adverse affect on the superconducting properties (e.g., residual resistivity) of the material.

Encasement of the brittle MOHTSC element, e.g., filaments or wires, in a matrix material is a potential approach to avoiding local stress concentrations which can result in failure of the element. The encasement medium, however, must be able to protect the superconductor from moisture and oxygen loss and must be a conductor that will not oxidize or deleteriously interact with the MOHTSC material. Further, any suitable matrix materials must be applicable to the MOHTSC element under conditions which do not cause chemical reactions with the MOHTSC material or otherwise deleteriously affect its composition and/or properties. In this respect, it is to be noted that the process conditions incident to the formation or deposition of the matrix material must likewise have no deleterious affect on the composition or performance properties of the MOHTSC material.

U.S. Pat. No. 4,845,308 issued Jul. 4, 1989 to E. A. Womack, Jr., et al describes a superconducting electrical conductor comprising an elongated porous substrate of bonded fibers, e.g., of aluminosilicate, with a coating of a 123 ceramic oxide superconductor. Such substrate is encased within an inner tube which is supplied with cryogen or other fluid for cooling the superconducting material. An outer tube surrounds the inner tube and defines a space which is evacuated for thermally insulating the inner tube from the ambient environment, with an electrical and heat insulator being provided around the outer tube. Adjacent lengths of the conductor are connected by a multiplicity of rigid rods each coated with superconducting material and held by a central plate-shaped perforated frame. The opposite ends of the rods are thrust into exposed ends of the porous substrate of the adjacent conductors. In this construction, the superconducting material is deposited onto and into the porous substrate of bonded fibers by methods such as chemical vapor deposition, evaporation deposition from a liquid or sol-gel solution, or by deposition from a precursor laden fluid.

U.S. Pat. No. 4,860,431 issued Aug. 29, 1989 to W. G. Marancik, et al describes the manufacture of multifilamentary intermetallic superconductors comprising $Nb_3Sn$. Plural copper tubes are filled with an alloy of tin to form copper-tin wires which are cabled around a core niobium wire. The resulting strands are provided in the copper tube, or a copper foil or finely wound copper wire and drawn to produce multifilament wire. Heat treatment then is employed to effect diffusion of tin and form the product intermetallic superconductor at the surface of the niobium filaments. The aluminum is said to appreciably increase the tensile strength of the tin and facilitate the processing of the composite material. The patent notes at column 4, lines 25-27 that the superconducting properties are not deteriorated by the addition of aluminum.

U.S. Pat. No. 4,857,675 to W. G. Marancik, et al discloses a forced flow type superconducting cable-in-conduit which is formed by cabling multifilamentary superconducting subcables around a first tube alternately with stainless steel wire or cable, and forming a second tube around the resulting composite. The double tube composite yielded by this procedure then is flattened to form a cable in a jacket. The superconductor in such structure may be $Nb_3Sn$ or $V_3Ga$.

An approach to making wires out of superconductive material which has been proposed (see U.S. Pat. No. 4,079,187 to Fillunger et al; U.S. Pat. No. 4,377,032 to Benz; and U.S. Pat. No. 4,489,219 to Sunaga et al) involves embedding filaments of a non-MOHTSC superconductive material in an electrically conductive matrix such as copper or copper alloy. U.S. Pat. No. 4,529,837 to Borden discloses encasing non-MOHTSC superconductor filaments in a copper cladding, with the resulting wire bent to shape to form so-called Rutherford-type superconductor cable.

In connection with the foregoing, it is to be appreciated that the superconductor materials described in the above-discussed references, such as $Nb_3Sn$, $V_3Ga$, Nb$_3$Ge, etc., are not MOHTSC materials, and do not have the severe moisture and oxygen sensitivity problems which characterize the MOHTSC materials.

It is an object of the present invention to provide a superconducting composite article comprising MOHTSC material, wherein the MOHTSC material is protected from moisture and oxygen loss in use, so that the material and electrical properties of the MOHTSC material are maintained despite exposure to environmental conditions which would otherwise adversely affect same.

It is another object of the present invention to provide a superconducting composite article comprising an MOHTSC element which can be fabricated without adverse affect on the material and electrical properties of the MOHTSC constituent thereof.

It is a still further object of the present invention to provide a superconducting composite article comprising small diameter MOHTSC filaments whose mechanical properties and environmental stability are far superior to those of the filament per se.

Other objects and advantages will be more fully apparent from the ensuing disclosure and appended claims.

SUMMARY OF THE INVENTION

In one aspect, the present invention relates to a superconducting composite article comprising an MOHTSC element coated on an exterior surface thereof with a noble or otherwise inert metal, in a conductive metal matrix.

The metal coating on the MOHTSC element's exterior surface may comprise a non-noble inert metal, such as nickel, which is depositable at sufficiently low temperature so that it does not chemically react with the MOHTSC element, provided that the composite article is used at sufficiently low temperature so that the MOHTSC element retains its superconductivity characteristics in use.

Alternatively, such metal coating may comprise a noble metal selected from the group consisting of gold, palladium, platinum, silver, and iridium.

The matrix metal may be any suitable metal, for example a metal such as aluminum, nickel, copper, indium, tin, tungsten, silver, gold, magnesium, beryllium, tantalum, molybdenum, niobium, chromium, cobalt, iridium, iron, zinc, rhodium, or rhenium, or combinations thereof. Generally, the matrix metal desirably has a resistivity below about 20 microohm-centimeters, and is non-reactive (i.e., reactive metals such as lithium and sodium are not usefully employed). The metal matrix may be formed from a single metal species, or alternatively from alloys, blends, mixtures, intermetallics, eutectics, or other combinations of different metals.

The conductive metal matrix may take the form of a cladding layer on the noble metal or inert metal-coated superconducting element, or alternatively, the conductive matrix metal may form a continuous matrix body in which one or a plurality of noble metal-coated or inert metal-coated superconducting elements are embedded.

As used herein, the term "superconducting composite article" refers to a composite article comprising a metal oxide high temperature superconductor (MOHTSC) which becomes superconducting at a relatively high temperature, i.e., at least about 20° K.

In another embodiment, the superconducting composite article of the present invention may comprise an array of parallelly aligned, spaced-apart superconducting fibers, each coated on an exterior surface thereof with noble or inert metal, and in a conductive metal matrix. Such article may optionally comprise a conductive metal foil support on which the conductive metal matrix containing the noble metal-coated or inert metal-coated superconducting fibers is disposed.

In another aspect, the invention relates to a method of forming a superconducting composite article, comprising:

(a) providing an MOHTSC superconducting element;

(b) depositing on an exterior surface of the MOHTSC superconducting element a coating of noble or inert metal, and (c) depositing on the noble or inert metal-coated MOHTSC superconducting element a conductive matrix metal.

The noble or inert metal and the matrix metal may be applied in the process broadly described above by any suitable techniques, including plasma spraying, chemical vapor deposition, and the like. It will be understood that the specific process used to apply the noble or inert metal may be the same as, or different from, the application process for the matrix metal. The noble or inert metal application technique, regardless of whether it is the same as the matrix metal application technique or not, is subject to the additional criterion that it be carried out at sufficiently low temperature to avoid reaction with, or other deleterious affect on, the underlying MOHTSC material.

In another aspect of the invention, a metal is applied to a heated substrate (e.g., the noble metal-coated or inert metal-coated superconducting element), by introducing a liquid organometallic precursor compound, whose metal moiety is the metal constituent to be deposited, onto an atomizing surface capable of being vibrated at ultrasonic frequencies. The atomizing surface is vibrated at a sufficient ultrasonic frequency to generate a droplet dispersion of the liquid organometallic precursor compound, and the droplet dispersion is directed to the heated substrate, for decomposition of the organometallic compound and deposition of the metal moiety thereof on the heated substrate. A spray of dispersed droplets may for example be directed to the heated substrate at low velocity, as for example on the order of from about 0.2 to about 10 feet per second.

Other aspects and features of the invention will be more fully apparent from the ensuing disclosure and appended claims.

BRIEF DESCRIPTION OF THE DRAWINGS

FIG. 14 is a schematic representation of a process system for ultrasonic spray deposition of triisobutylaluminum (TIBAL) on a heated ceramic oxide semiconductor substrate, to yield a deposited aluminum metal coating on the substrate.

FIG. 14A is an enlarged perspective view of the schematic process system in the interior of the housing shown in FIG. 14.

FIG. 15 is an optical micrograph of a composite article comprising glass filaments coated with platinum and embedded in a matrix of aluminum.

DETAILED DESCRIPTION OF THE INVENTION, AND PREFERRED EMBODIMENTS THEREOF

Figure 1:
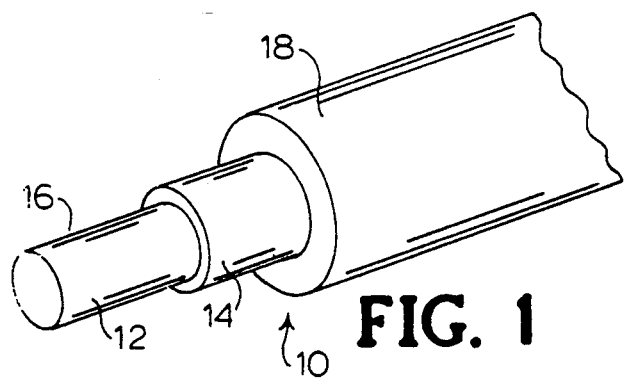
FIG. 1 is a perspective view of a superconducting composite article according to one embodiment of the present invention, comprising an MOHTSC fiber coated on an exterior surface thereof with noble or inert metal, and overlaid with a cladding of a conductive metal.

The present invention contemplates a superconducting composite article comprising an MOHTSC element which is coated on its exterior surface with noble or inert metal. As mentioned, the metal coated on the MOHTSC element's exterior surface may comprise an "inert" metal, i.e., a metal which does not physically or chemically react with the MOHTSC material under metal application or composite article use conditions so as to deleteriously affect the superconducting properties of the MOHTSC material. For current carrying applications, it is also critical that the metal provide intimate ohmic contact with the MOHTSC material such that the current will be readily shunted to the metal matrix material at temperatures above the superconducting transition temperature. Preferably, however, the metal coated on the exterior surface of the MOHTSC element is a noble metal, e.g., platinum, palladium, gold, silver, iridium, and the like, as well as combinations of such metal species.

The noble or inert metal provides a hermetically sealing barrier coating for protecting the MOHTSC element from environmental constituents which may otherwise degrade the superconductor element and render it deficient or even useless for its intended purpose, in the absence of such noble or inert metal coating thereon.

The noble or inert metal-coated superconducting element is encased in a conductive matrix metal. The conductive matrix metal may comprise any suitable conductive metal. Preferably the matrix metal comprises a metal which is selected from the group consisting of aluminum, nickel, copper, indium, tungsten, tin, silver, gold, magnesium, beryllium, tantalum, molybdenum, niobium, chromium, cobalt, iridum, iron, zinc, rhodium, rhenium, or combinations of such metals. The conductive matrix metal may be provided as an outer cladding or coating layer overlying the noble or inert metal coating, or alternatively the conductive matrix metal may form a continuous matrix in which discrete noble or inert metal-coated element(s) are disposed. Such continuous matrix metal composites may suitably have one or a multiplicity of noble or inert metal-coated superconducting elements disposed in the matrix metal.

The matrix metal serves to provide a load-carrying ductile matrix which alleviates local stress concentrations caused by point stresses or defects in the superconductor element. Such ductile matrix material likewise alleviates the problems incident to the intrinsic brittleness of superconductors of the ceramic oxide type.

Further, the foregoing illustrative matrix metal species are amenable to deposition by techniques and under application conditions which do not degrade or otherwise affect the superconducting properties of the superconducting element, and these materials as indicated provide a high strength ductile matrix compensating for the low strength and brittleness of the superconductor material employed in the composite article.

In this respect, the matrix metal and interlayer (noble or inert metal coating) structure of the composite articles of the present invention overcome the problems incident to the use of materials such as copper or copper alloys for direct cladding of metal oxide high temperature superconductor materials. Direct cladding or plating of low temperature superconductor materials is taught in the art, as for example U.S. Pat. No. 4,079,187 to Fillunger et al; U.S. Pat. No. 4,377,032 to Benz; U.S. Pat. No. 4,489,219 to Sunaga et al and U.S. Pat. No. 4,529,837 to Borden, but such direct coating techniques are inapplicable to MOHTSC materials, for the reasons stated previously herein.

Thus, copper and copper alloys directly applied to the MOHTSC element by processes such as electroless plating expose the MOHTSC element to an aggressive aqueous environment which will degrade the superconducting properties of the MOHTSC element. Alternatively, high temperature melt infiltration of copper or copper alloy directly to MOHTSC elements such as filament arrays can be injurious to the performance of the superconductor, due to the tendency of the superconductor to lose oxygen from its structure during high temperature exposure. Generally, it is difficult to form dense, conformal films of copper or copper alloys directly on small diameter superconductor elements, without disrupting the superconducting properties thereof.

The matrix metal in the present invention is applied to a noble or inert metal interlayer on the MOHTSC element and overcomes such problems. In conjunction with the noble or inert metal interlayer on the MOHTSC element exterior surface, the matrix metal in the present invention permits the resulting composite to retain stability of the superconductor constituent even under otherwise adverse environmental exposure conditions, and such composite provides a normal state current path in service. In this respect, the noble or inert metal interlayer serves to minimize the formation of an oxide dielectric layer between the matrix metal and the superconductor substrate which would prevent the passage of electric current and destroy the utility of the superconductor element.

As used hereinafter, the terms "superconductor", "superconducting element", and "superconducting material" refer to structures and materials formed of any suitable MOHTSC material having superconducting properties, and preferably materials displaying superconductivity, i.e., near-zero electrical resistance, at temperatures above near absolute zero temperatures, preferably above 20° K. and most preferably above about 50° K.

Illustrative of superconductor materials which may be employed in the broad practice of the present invention are the metal oxide superconductors of the yttrium-barium-copper type ($YBa_2Cu_3O_x$ type), the so-called "123" HTSC materials, wherein x may be from about 6.0 to about 7.1, and preferably from about 6.4 to about 7.1, as well as materials where Y may be substituted by Nd, Sm, Eu, Gd, Dy, Ho, Yb, Lu, YO $5-Sc_{0.5}$, $Y_{0.5}$-$La_{0.5}$-$La_{0.5}$, and $Y_{0.5}$-$Lu_{0.5}$, and where Ba may be substituted by Sr-Ca, Ba-Sr, and Ba-Ca.

More generally, the superconductors in the composites of the present invention suitably comprises perovskite metal oxide superconductors which are admixtures of metals from Groups IB, IIA and IIIB of the Periodic Table.

Another specific class of superconductor materials potentially useful in the broad practice of the present invention includes MOHTSC materials of the general formula $(AO)_mM_2Ca_{n-1}Cu_nO_{2n+2}$, wherein the A cation can be thallium, lead, bismuth, or a mixture of these elements, m=1 or 2 (but is only 2 when A is bismuth), n is a number of from 1 to 5, the M cation is barium or strontium, and calcium may be substituted by strontium. Metal oxide superconductors of such type are described in "High Tc Oxide Superconductors," MRS Bulletin, January, 1989, pages 20–24, and "High $T_c$ Bismuth and Thallium Oxide Superconductors," Sleight A. W., et al, MRS Bulletin, January, 1989, pages 45–48.

Although the superconducting composite articles of the present invention are primarily described herein with reference to the provision of the MOHTSC material elements in filament form, it is to be recognized that the superconducting element(s) in the composite article of the present invention may take any suitable shape or form, depending on the structure and properties of the superconductor material, the end use article which is desired, and the end use application contemplated. For example, the superconducting composite article of the invention may utilize the superconducting element(s) in the form of wires or filaments, rings, needles, strips, disks, spheres, etc., the choice of specific configuration being readily selected or determinable depending on the product article and application. Further, the superconductor materials useful in the broad practice of the present invention may be made by any suitable methods now known or hereafter discovered in the art. As an illustration of conventional methods for forming superconductors, U.S. Pat. No. 4,804,649 issued Feb. 14, 1989 to F. G. Sherif describes an alkaline oxalate precipitation process for forming metal oxide ceramic superconductors of the 123 type.

Referring now to FIG. 1, there is shown a superconducting composite article 10 comprising a superconducting fiber 12 of a material such as a 123 MOHTSC material. The diameter of the MOHTSC fiber 12 may be on the order of from about 25–100 microns. Such fibers are commercially available from CPS Superconductor Corporation (Cambridge, Mass.). The superconductor fiber has coated thereon a noble or inert metal coating 14, which may for example comprise a platinum coating with a thickness of from about 200 nanometers (nm) up to about 2.5 microns, or higher. Desirably, the thickness of the noble or inert metal coating 14 is relatively uniform on the superconductor fiber exterior surface 16.

The noble or inert metal-coated superconductor element is disposed in a metal matrix cladding 18. The matrix metal, as indicated, may comprise metals such as aluminum, nickel, copper, indium, tungsten, tin, silver, gold, magnesium, beryllium, tantalum, molybdenum, niobium, chromium, cobalt, iridium, iron, zinc, rhodium, rhenium, etc., or combinations (e.g., alloys, eutectics, intermetallics, blends, complexes, mixtures, or composites) of such materials. Preferably, the matrix metal is a metal selected from the group consisting of aluminum, nickel, indium, and copper, with aluminum generally being the most preferred of such metal species.

The metal matrix cladding may have any suitable thickness appropriate to the end use application contemplated for the composite article. Depending on such application, the matrix metal may form a relatively thin overcoat on the noble or inert metal coating, or alternatively, the matrix metal may be provided in the form of an extended volume matrix component, in which the noble or inert metal-coated superconductor element is embedded, as in the composite article shown in FIG. 2.

Figure 2:
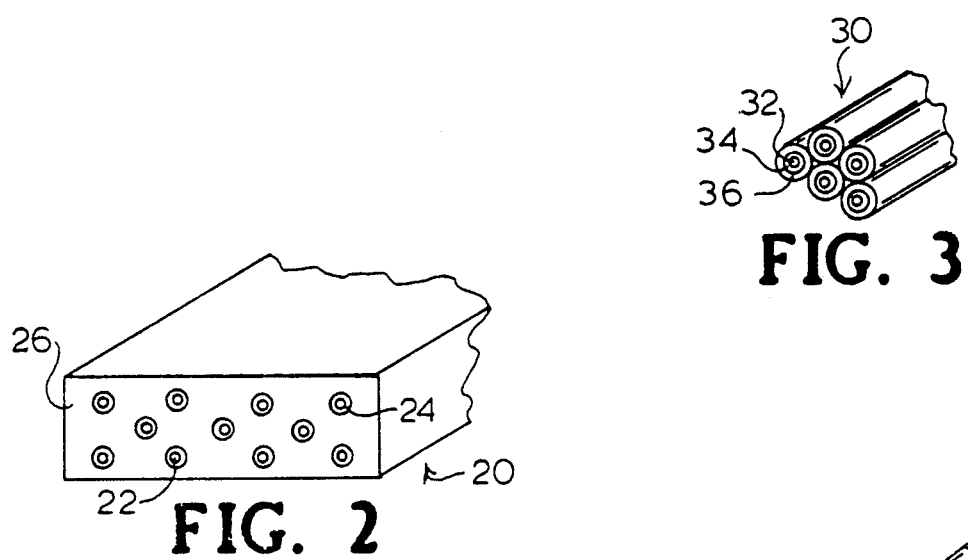
FIG. 2 is a perspective view of a superconducting composite article according to another embodiment of the invention, comprising noble or inert metal-coated MOHTSC filaments in a continuous phase matrix metal.

Referring now to FIG. 2, there is shown a superconducting composite article 20, comprising a plurality of superconducting fibers 22, each of which is coated on its longitudinally extending exterior surface with a noble or inert metal coating 24, with the resulting coated fibers being parallelly aligned in proximity to one another. The array of coated fibers is embedded in the metal matrix 26, which may be formed of aluminum, nickel, indium, copper, etc. (or suitable alloys, mixtures, eutectics, intermetallic compounds, or other combinations thereof).

Figure 3:
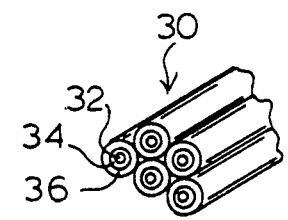
FIG. 3 is a perspective view of a close-packed array of MOHTSC fiber composite elements, according to another embodiment of the invention.

Another form of superconducting composite article which may be employed in the broad practice of the present invention is shown in FIG. 3, wherein the composite article 30 comprises a close-packed array of superconducting fibers 32, each of which is coated on an exterior surface thereof with a noble or inert metal coating 34. These noble metal-coated fibers in turn are coated with a matrix metal, to form the outer coating layer 36 of the element. A multiplicity of such elements are joined to one another, such as through interbonding of the matrix metal outer coatings of adjacent coated fibers, or by bonding of elements to one another with a suitable bondant material, to form a multifilament unitary product article.

Figure 4:
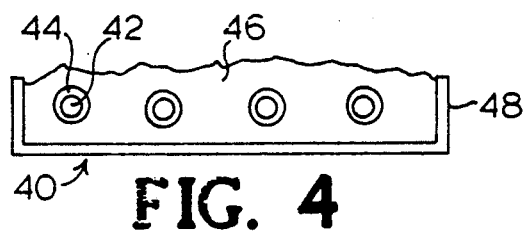
FIG. 4 is an elevation view of a superconducting composite article according to another embodiment of the invention, comprising a conductive foil support.

FIG. 4 shows another embodiment of a superconducting composite article according to the invention. In this embodiment, the composite article 40 comprises an array of parallelly aligned, laterally spaced-apart superconductor filaments 42, each of which has coated on an exterior surface thereof a noble or inert metal coating 44. The noble or inert metal-coated fibers are disposed in a metal matrix 46 of a matrix metal, e.g., aluminum, nickel, indium, copper, etc., or alloys, mixtures, or other combinations thereof. Disposed about the metal matrix 46 on the bottom and side surfaces thereof is a conductive foil support 48, on which the fiber/matrix structure may be formed during manufacture of the composite article.

Figure 5:
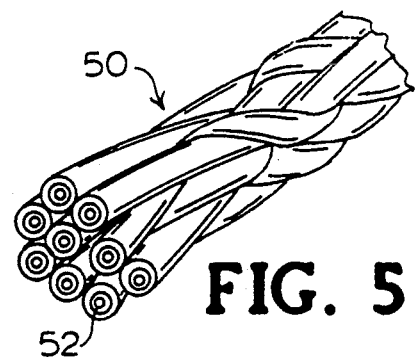
FIG. 5 is an array of composite superconducting fiber elements, wherein the fiber elements are twisted to cancel electromagnetic field interference potentially adverse to the superconducting character of the constituent fiber elements.

FIG. 5 shows a superconducting composite article 50 comprising an array of superconducting fibers 52 having coated on an exterior surface thereof a noble or inert metal coating, overcoated with a conductive coating of a suitable matrix metal species. In this construction, the coated superconducting elements 52 are generally helically wrapped or braided, to thereby overcome electromagnetic field cancellation effects which can occur in a close-packed array of superconducting elements, wherein the electromagnetic fields of adjacent elements can interfere and destroy the superconductive character of such filaments. By twisting or bending the constituent elements, as shown in FIG. 5, the component electromagnetic fields of the proximate elements cancel each other and all elements remain superconductive. Although shown in the specific form illustrated in FIG. 5, it will be appreciated that various other conformations of closely-spaced superconducting elements may be employed to eliminate such electromagnetic field cancellation effects.

Although the embodiments shown variously in FIGS. 1-5 employ superconducting elements of fiber or filament form, it will be appreciated that the utility of the present invention is not thus limited, but rather extends to any other shapes and forms which may be useful and appropriate to the end use application for the composite article of the present invention, including the alternative forms and shapes of such elements illustratively described earlier herein. Incorporation of high strength fibers of glass, graphite and aramid, into the matrix system shown in FIGS. 2 and 4 would further enhance the mechanical properties of the superconducting composite article.

A particularly useful form of the composite article of the present invention utilizes an array of parallelly arranged superconducting fibers which are spaced apart from one another in a generally planar array. Such a composite structure is shown for the interlayer-coated superconducting fibers 42 in the FIG. 4 embodiment, wherein the matrix metal 46 is employed to embed the interlayer-coated fibers in the manner shown, to produce a "tape" composite article useful in applications such as motors, magnets, generators, interconnects in power transmission lines, etc.

In general, the noble or inert metal coating may be formed on the MOHTSC element in the practice of the present invention by any suitable means and method suitable for forming a barrier layer between the superconducting element and the matrix metal, and hermetically seal the superconducting element against the environment. Examples of potentially useful noble or inert metal coating application methods include chemical vapor deposition, laser ablation, reactive evaporation, molecular beam epitaxy, plasma sputtering, etc. The method of application of the noble or inert metal coating is subject to the constraint that it does not involve conditions or generate species which degrade the MOHTSC material or otherwise render it unsuitable or deficient for its intended purpose, while still providing intimate ohmic contact.

A preferred method of applying the noble or inert metal coating to the superconducting element is by chemical vapor deposition in which the deposited noble or inert metal derives from an organometallic compound whose metal moiety is the noble or inert metal. As previously mentioned, in order to preserve the superconducting properties of the superconductor element, such element must be protected from moisture and oxygen loss or chemical degradation near the surface. Loss of oxygen can occur as a result of chemical reactions or exposure to reducing conditions at high temperature. Chemical degradation can occur as a result of high constituent mobilities at high temperatures. Accordingly, the chemical vapor deposition (CVD) process must be carried out in the practice of the present invention at sufficiently low temperature to avoid detrimental effect on the superconductor element. The noble or inert metal coating itself serves to protect the superconductor element surface so that it subsequently is not oxidized or otherwise adversely affected by the environment and/or matrix metal while still preventing intimate ohmic contact for current carrying applications.

As an example, gold is an attractive noble metal species for forming the interlayer on superconductor elements in the practice of the present invention, since organometallic gold compounds are commercially available for which the deposition temperature may be as low as 300° C. In addition, gold has been employed as a substrate for growing of oriented HTSC thin films of high quality, as reported in Chien, C. L., et al, *Appl. Phys. Lett.*, Vol. 51, No. 5, page 2155 (1987). As a further characteristic favoring gold as an interlayer material, aluminum, a preferred matrix metal, exhibits little solubility for gold and low melting point depression therewith. Gold has a high density, and diffusion of oxygen and aluminum through gold may typically be expected to be relatively low, based on characteristic diffusion coefficients at temperatures generally employed for aluminum deposition. An illustrative organometallic gold source reagent is dimethylgoldhexafluoroacetylacetonate, which decomposes to yield high quality gold films.

Another noble metal species which may be usefully employed to form interlayers in the superconducting composite articles of the present invention is platinum, which may be derived from a suitable organoplatinum source compound such as platinum acetylacetonate. Platinum acetylacetonate may be employed at deposition temperatures as low as 300° C. and produces a deposited platinum metal film that is specular and highly uniform. Even lower deposition temperatures may be achieved (170°–180° C.) using methylcyclopentadienyltrimethylplatinum.

Other preferred noble metal species which may be potentially usefully employed in the broad practice of the present invention include palladium, silver, and iridium.

Among the illustrative matrix metal species hereinearlier described, aluminum (which as indicated includes aluminum alloys), is a particularly preferred matrix metal in superconducting composite articles of the present invention. Aluminum retains good ductility at sub-zero temperatures, and aluminum alloy 2219-T87 (6.3% copper, 0.3% manganese, 0.06% titanium, 0.18% zirconium, and 0.1% vanadium) has been employed for containment of liquid oxygen and hydrogen, and retains good mechanical properties and structural integrity at low temperature exposure levels. Various other 2000 series aluminum alloys with different tempers may also be potentially usefully employed in the broad practice of the present invention. Many such aluminum alloys, may be dramatically increased in strength characteristics, by heat treatment at temperature levels on the order of approximately 500° C. The choice of a specific aluminum material, or other suitable matrix metal species, will be readily determinable based on considerations of mechanical and other physical properties, and the character of the end use application in which the superconducting composite article comprising such matrix metal is employed.

The matrix metal may be applied to the noble or inert metal-coated superconducting element in any suitable manner, as for example by plasma spraying, electric arc spraying, flame spraying, or any other suitable metallizing method which is efficacious to deposit the matrix metal in a selected shape and at desired thickness on the noble or inert metal-coated superconducting element.

It has been found by the inventors that metals may be deposited on a heated substrate utilizing spray application of organometallic precursor compounds whose metal constituent is the metal sought to be deposited. This deposition method is particularly advantageously employed in applying matrix metals to noble or inert metal-coated substrate elements at much higher deposition rates than are normally achieved in vapor deposition processes, to form the superconducting composite articles of the invention.

The application of aluminum is illustratively described hereinafter, utilizing the aforementioned spray application technique, wherein triisobutylaluminum is utilized as the organoaluminum precursor compound. Such metal-organic chemical vapor deposition (MOCVD) technique affords the advantage of depositing the matrix metal onto the noble or inert metal-coated surfaces of the superconducting element at high rates and at low temperatures. The matrix metal applied to the superconducting elements improves the fracture resistance of the superconductor element by encapsulating same within a high strength, ductile matrix, which moreover provides a normal state current path in service. The layer of noble or inert metal can also be deposited using MOCVD techniques, to provide a hermetic seal and to prevent scavenging of oxygen from the superconducting element by the subsequent matrix metal application process.

The present invention thus affords the fabrication of environmentally stable superconductor composite articles utilizing application techniques, such as MOCVD application of interlayer and matrix materials, which are readily implemented and easily carried out for commercial-scale manufacture of superconducting composite articles. Such composite articles and the method of making same thus overcome the obstacles of inherent brittleness of ceramics and susceptibility to flaws which have limited the utility of MOHTSC superconductors in applications such as motor coils, magnets, generators, transformers and the like.

A particularly preferred structure in the broad practice of the present invention is a superconducting composite tape of he type illustratively shown in FIG. 4 hereof, wherein the foil carrier presents a useful substrate or base structure for positioning of the high temperature superconductor filaments, prior to coating of same. Subsequently, the foil carrier may be retained in its initial position, or alternatively, the foil may be leached or dissolved away by a suitable solvent, to leave the fiber/matrix article as the desired product. Such superconducting composite tapes are highly environmentally stable, and afford a convenient structure for the use of superconducting filaments in applications such as magnet windings and motor coils.

Figure 6:
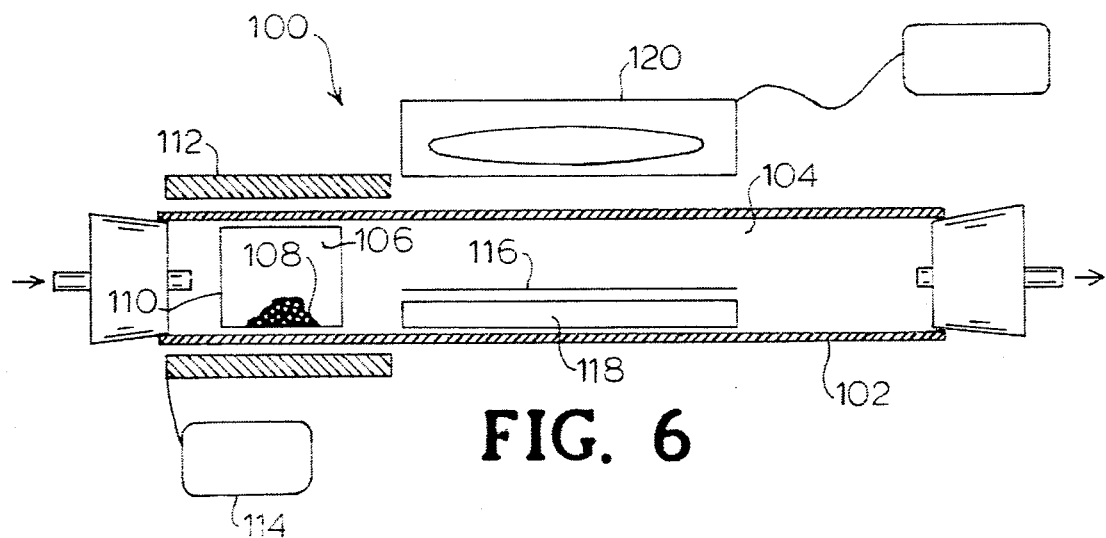
FIG. 6 is a schematic representation of a process system for chemical vapor deposition which may be usefully employed to deposit platinum onto ceramic oxide superconductor filaments.

FIG. 6 is a simplified schematic representation of a process apparatus for riously interact with the MOHTSC material. Further, any suitable matrix materials must be applicable to the MOHTSC element under conditions which do not cause chemical reactions with the MOHTSC material or otherwise deleteriously affect its composition and/or properties. In this respect, it is to be noted that the process conditions incident to the formation or deposition of the matrix material must likewise have no deleterious affect on the composition or performance properties of the MOHTSC material.

The organometallic reagent heating zone 106 contains a suitable quantity of an organometallic reagent 108. In the case of platinum as the noble metal to be deposited, this reagent may suitably comprise platinum acetylacetonate, which is a yellow powder solid at room temperature. The organometallic reagent for the interlayer is loaded into a copper tube 110 which is positioned upstream of the deposition zone 104. The copper tube provides additional thermal mass, enabling more accurate temperature control of the heating of the organometallic precursor compound for the noble metal to be achieved. Heating of such precursor compound is carried out with a flexible resistance heating tape 112 connected to a PID-type temperature controller 114.

The superconductor fibers 116 to be coated in the FIG. 6 apparatus are disposed on a refractory boat 118, with any suitable number of filaments, e.g., six, being used in each run. The respective filaments are parallelly aligned in the longitudinal direction (along the axis of the quartz tube 102) and are laterally spaced-apart from one another.

The refractory boat 118 functions as a support for the filaments 116, with the rough surface of the refractory material allowing the organometallic reagent to penetrate underneath the fibers disposed on the boat, to achieve a relatively uniform coating of the noble metal on the respective filaments. An infrared lamp 120 is disposed above the deposition zone 104. The infrared lamp is connected to a variable resistance control (Variac) unit to control the intensity of infrared heating. The filaments thereby are heated primarily by radiative heat transfer, since low mass objects such as individual fibers, when placed in a vacuum, are very difficult to heat by solid/gas conduction. Although the reagent heating zone 106 and deposition zone 104 are in close proximity to one another, the infrared lamp 120 has a negligible effect on reagent temperature control. By way of example, initial conditions employed in deposition of platinum from a platinum acetylacetonate source compound are shown in Table I below.

TABLE I

| Process Parameter | Indentity/Condition |
| --- | --- |
| carrier gas | air |
| carrier gas flow rate | 50 cubic centimeters/min. |
| pressure | 1 Torr |
| temperature of platinum acetylacetonate | 175° C. |
| deposition temperature | 275° C.–320° C. |
| running time | 10–12 minutes |
| starting amount of platinum acetylacetonate | 0.4 grams |

In the process system illustratively described above, air is used as a carrier gas, at a flow rate of 50 cubic centimeters per minute, measured at 760 Torr. At a pressure of 1 Torr, the actual expanded volumetric flow rate of air through the system is $3.8 \times 10^4$ cubic centimeters per minute. Based on the volume of the deposition zone, the residence time of a gas molecule therein would be approximately $5 \times 10^{-4}$ minutes.

Figure 7:
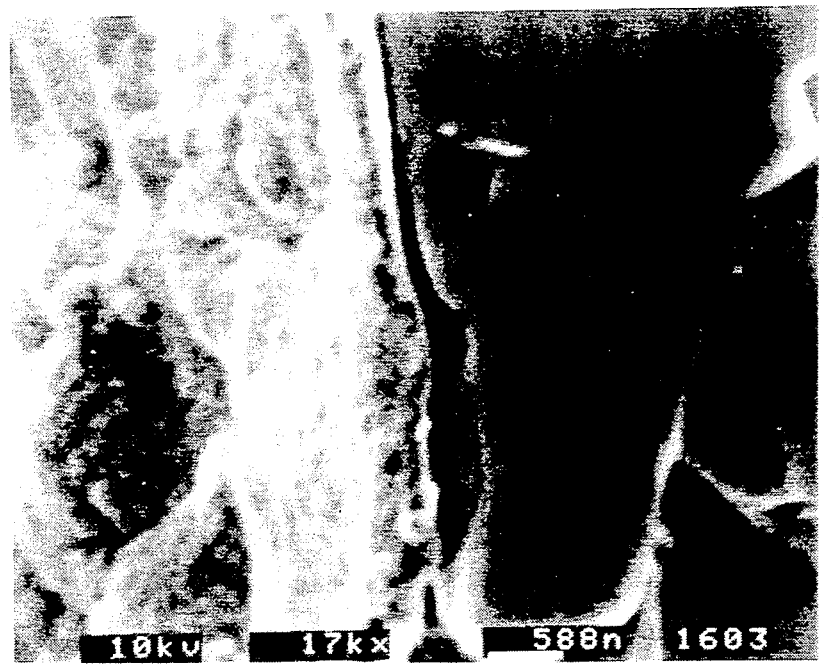
FIG. 7 is a photomicrograph of a platinum coating on a ceramic oxide superconducting filament, at a magnification of 17,000 times, and at a platinum coating thickness of 300 namometers
Figure 8:
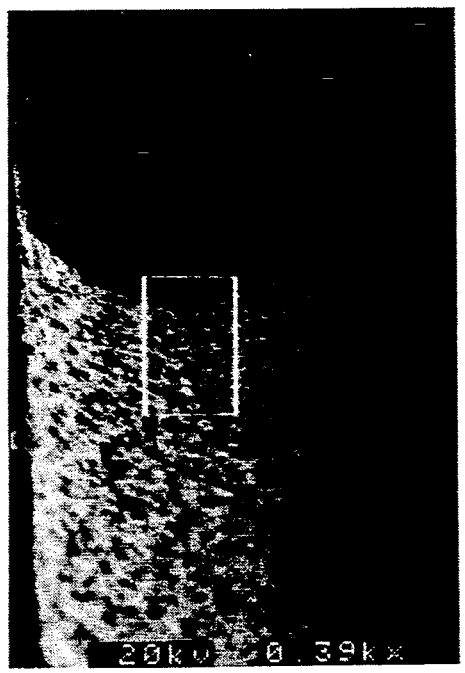
FIG. 8 is a photomicrograph of a ceramic oxide superconductor filament, at a magnification of 390 times, showing the surface characteristics thereof.

FIG. 7 is a photomicrograph of a platinum coating formed on 123 MOHTSC filaments under the process parameters and conditions given in Table I. For purposes of comparison, a corresponding uncoated 123 MOHTSC filament is shown in FIG. 8, with the portion of the surface demarcated by the white rectangle in the left center portion of FIG. 8 being shown in magnified view in FIG. 9. The electron photomicrograph of FIG. 7 was taken at a voltage of 10 KV and a magnification of 17,000 times, with the scale of the photomicrograph being shown by the line in the lower right-hand portion of the photomicrograph, representing a distance of 588 nanometers (nm). The electron photomicrograph of FIG. 8 was taken at a voltage of 20 KV and a magnification of 390 times, while the enlargement view in FIG. 9 has a scale which is represented by the line in the lower left-hand portion thereof representing a distance of 25.6 microns.

Figure 9:
FIG. 9 is an enlargement of the area of the FIG. 8 photomicrograph which is demarcated by a white rectangle in the central portion thereof.

As shown in FIGS. 8 and 9, the surface of the 123 MOHTSC fiber is extremely rough, however the platinum coating (approximately 300 nanometers in thickness) conforms tightly to the fiber surface and appears to be relatively dense in character.

If the same illustrative system employed to form the platinum coating shown in FIG. 7 on a 123 MOHTSC filament is operated with the starting amount of the platinum acetylacetonate reagent increased to 0.4 grams, a platinum coating having an average thickness on the order of about 600 nanometers is formed. The resulting platinum coating is shown in the sectioned perspective view of FIG. 10, which was taken at a voltage of 20 KV and magnification of 8200 times. The scale of this photomicrograph is shown by the line at the lower right-hand portion of the photomicrograph, representing a distance of 1.22 microns.

Figure 11:
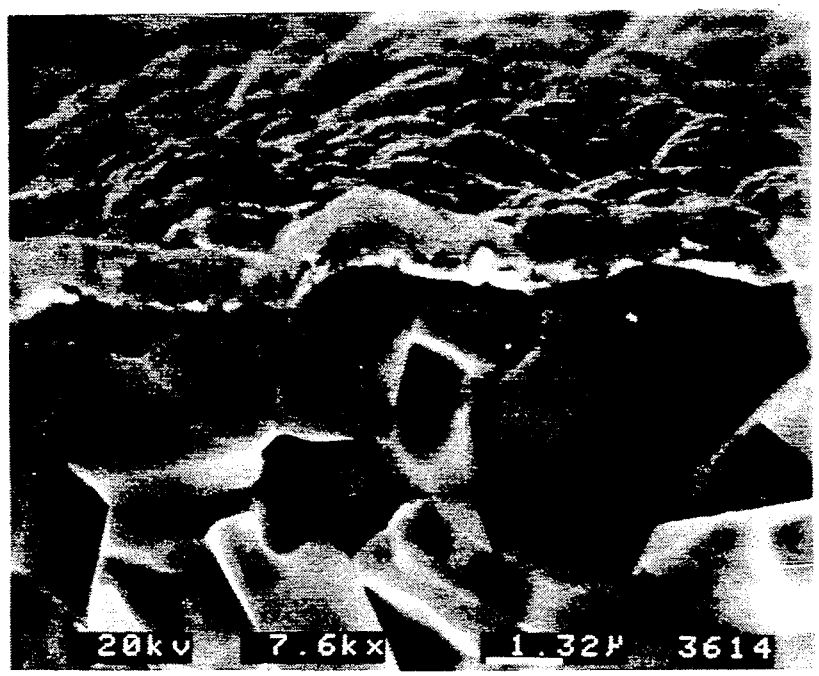
FIG. 11 is a photomicrograph, at magnification of 7,600 times, of a 1.2 micron thick coating of a platinum on a ceramic oxide superconductor filament.

Operating the same platinum coating system with a starting weight of platinum acetylacetonate of 0.8 grams produced a platinum coating as shown in FIG. 11, having an average thickness on the order of 1.2 microns. The photomicrograph of FIG. 11 is taken at a voltage of 20 KV and magnification of 7600 times, with the scale of the platinum coating being shown by the line in the lower right-hand portion of the photomicrograph, representing a distance of 1.32 microns.

Figure 10:
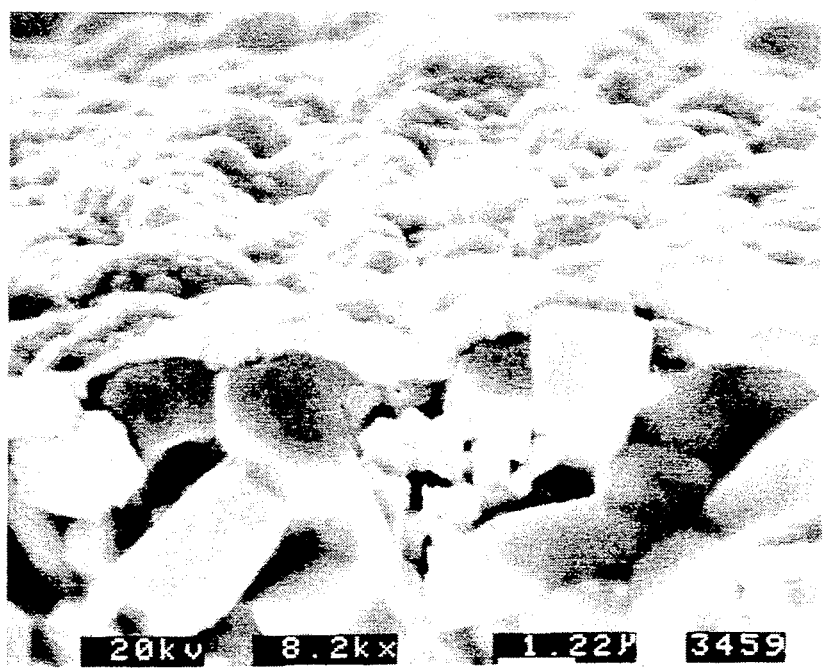
FIG. 10 is a photomicrograph at a magnification of 8,200 times, of a selected perspective view of a 600 nanometer thick coating of platinum on a ceramic oxide superconductor filament.
Figure 12:
FIG. 12 is a perspective view of a platinum-coated ceramic oxide superconductor filament at 7,300 times magnification, wherein the platinum coating is 2.5 microns in thickness.

Visual inspection of the photomicrographs of FIGS. 7, 10, and 11 show that in each case the platinum coating conforms tightly to the MOHTSC fiber surface. These results further show that the coating thickness is directly proportionally to the starting amount of the platinum source reagent, platinum acetylacetonate, as would normally be expected. FIG. 12 shows a perspective view of a 123 MOHTSC filament on which a 2.4 micron thick coating of platinum has been deposited, utilizing a deposition process system of the type schematically shown in FIG. 6.

As shown in FIGS. 10, 11, and 12, the noble metal coating thickness is relatively uniform, even at a large thickness of 2.5 microns, as shown in FIG. 12.

Figure 13:
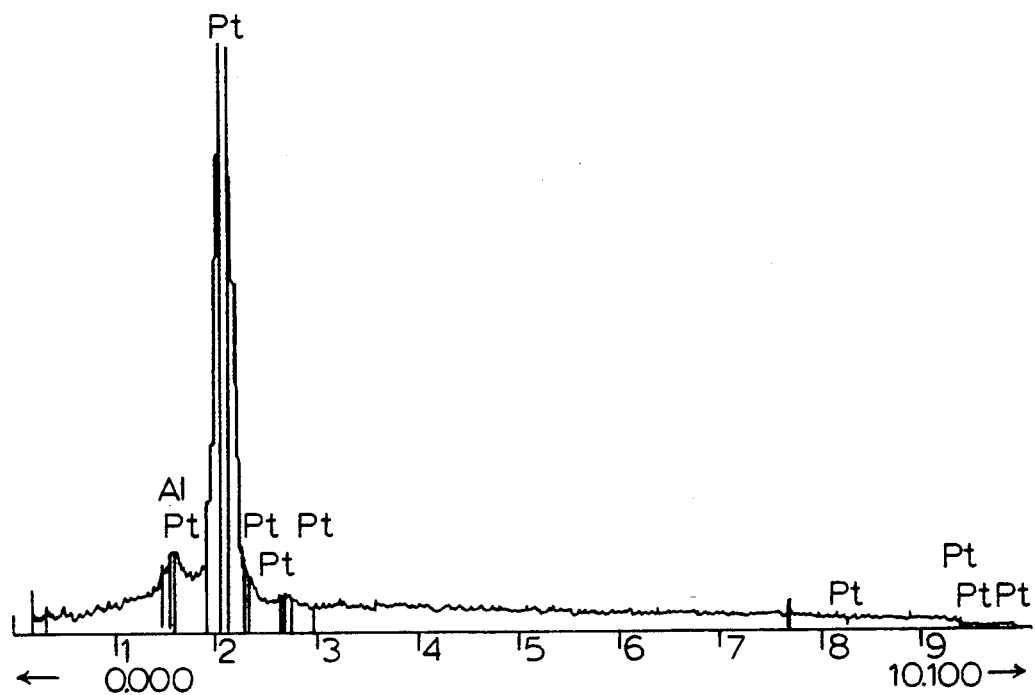
FIG. 13 is an energy dispersive spectrograph of a platinum-coated ceramic oxide superconductor filament.

Platinum-coated MOHTSC fibers of the type shown in FIGS. 7, 10, 11, and 12 have been subjected to Energy Dispersive Spectroscopy (EDS) of the coated fiber surface. The resulting spectrographs, such as the one illustratively shown in FIG. 13, show that the deposition product on the MOHTSC filament is entirely platinum. As shown in FIG. 13, there is a small aluminum peak on the spectrograph, which derives from the aluminum stage on which the HTSC fibers are mounted during the deposition process.

The noble metal-coated 123 MOHTSC filaments formed as above described may thereafter be incorporated in a ductile metal matrix to form a "tape" or other composite article. In the instance of a tape conformation, the resulting composite article provides a durable system which is well-suited to the manufacture of filament wound motors and magnets. As indicated hereinabove, the specific shape or conformation of the superconducting composite article will depend on the character of the matrix material, its method of application, and the end use contemplated for the resulting superconducting composite article.

Although the foregoing discussion of noble metal coating of the superconducting element has been directed primarily to platinum, it will be recognized that other noble metal species, such as gold, palladium, silver, and iridium, may be satisfactorily employed in various applications of the present invention, depending on the specific character of the superconducting composite article and end use application therefor.

With respect to the matrix metal, the same may advantageously comprise a metal selected from the group consisting of aluminum, nickel, indium, and copper, with aluminum being highly preferred.

Although any suitable method of application of the matrix metal to the noble or inert metal-coated superconducting element may be employed in the broad practice of the present invention, thermal spray coating ("metallizing") and ultrasonic spray coating in general are preferred. Illustrative examples of these preferred methods are described below.

FIG. 14 shows a schematic representation of a process system for ultrasonic spray deposition of metal, which may usefully be employed to apply matrix metal to noble or inert metal-coated superconducting elements, as hereafter described.

As shown, the deposition system 200 comprises a deposition furnace 202 including a stainless steel six-way cross vessel, comprising ports 204, 206, 208, and 210, with two remaining ports not shown for clarity, but being perpendicular to the plane of the other four ports shown in the drawing.

A quartz-sheathed cartridge heater 212 is fitted through one port and employed to heat noble metal-coated 123 MOHTSC filaments, which in turn are disposed on an aluminum foil carrier 214, more clearly shown in FIG. 14A, wherein all parts and features are numbered correspondingly with respect to FIG. 14. The aluminum foil carrier 214 in turn is reposed on a copper sleeve 216, containing the cartridge heater 212. Deposition in the furnace 202 may be carried out at any suitable temperature, depending on the character of the organometallic precursor source compound for the matrix metal constituent. For example, in the case of triacetylbutylaluminum (TIBAL) as the organometallic precursor compound for aluminum as the matrix metal, the deposition operation may be carried out at a temperature on the order of about 250° C. The furnace is provided with a quartz viewing port (not shown for clarity) to allow for direct observation of the metal matrix growth.

At the upper port 210 of furnace 202 is mounted an ultrasonic spray nozzle 218, which is capable of producing atomized droplets of small diameter, as for example on the order of about 18 microns, when TIBAL is employed as the source reagent for aluminum deposition. The ultrasonic nozzle 218 utilizes piezoelectric crystals to vibrate an atomizing surface of spray tip 220 at ultrasonic frequencies, e.g., frequencies above 100 kilohertz (kHz). Suitable ultrasonic nozzles of such type are commercially available from Sono-Tek Corporation (Poughkeepsie, N.Y.).

The organometallic source reagent for the matrix metal constituent is fed to the ultrasonic nozzle 218 by means of a syringe pump 220 which is joined to the ultrasonic nozzle by means of feed conduit 224.

The cartridge heater 212 has thermocouple probes 226 and 228 disposed therein and extending externally of the furnace 202 through port 204 and thermocouple sleeve 230. These thermocouple probes are joined to suitable monitoring and/or control means (not shown) as may be appropriate to controllably establish and maintain a selected temperature in the furnace for deposition of the metal constituent of the organometallic source compound.

At its opposite end 232, the cartridge heater 212 is joined by means of a signal transmission wire 234 to a suitable temperature controller 236, by means of which the cartridge heater is operated to establish and maintain a selected temperature in the furnace, as monitored and/or controlled by means of the thermocouple probes 226 and 228. For such purpose, the thermocouple probes may be joined in signal transmitting relationship to the temperature controller 236, which thereby is arranged for feedback to maintain a desired set point temperature in the furnace.

The FIG. 14 batch process system may suitably be substituted by a process system which is adapted and operated for continuous processing, i.e., wherein a continuous foil carrier (support) strip has continuous noble metal-coated filaments deposited thereon, and is continuously passed through the coating chamber for spray deposition of aluminum thereon.

As an example of the operation of the FIG. 6 process system utilizing TIBAL as a precursor compound for aluminum deposition on the noble metal-coated filaments 240 disposed on the foil carrier 214 (see FIG. 14A), the TIBAL liquid supplied by the syringe pump 222 passes through feed conduit 224 to the titanium spray tip 220 of the ultrasonic nozzle 218. The liquid which is introduced onto the atomizing (vibrating piezoelectric) surface of the titanium spray tip is spread as a thin film on this surface and set into motion and dispersed under ultrasonic frequency conditions as a spray of drops. Such spray is characterized by low velocity, which typically is on the order of from about 0.7 to 1.2 feet per second, as compared to a velocity of from about 35 to about 70 feet per second for conventional pressure nozzles employed for spraying liquids. The ultrasonic spray nozzle thus produces a minimal drop size while at the same time it maintains maximum vacuum and minimum fiber disruption on the foil carrier. The syringe pump provides a feed rate which is closely controllable so that extremely accurate flow rates for low volume flow conditions are achievable. The size of the syringe employed in the syringe pump may be varied widely, depending on the nature and extent of deposition which is desired to be carried out in the process system.

The matrix metal species may also be applied by thermal spray conditions (or "metallizing") methods, such as plasma-arc spraying, electric arc spraying, and flame spraying.

Plasma-arc spraying is a process in which the coating material is melted with heat from a plasma torch that generates a non-transferred arc. The term "non-transferred arc" refers to a constricted arc between an electrode (e.g., an aluminum wire in the case of aluminum deposition) and the constricting nozzle of the spray gun. An inert gas is introduced at high pressure, and is employed to atomize the molten metal into fine droplets and to deliver the spray to the substrate. For low volume deposition applications, the spray nozzle may be incorporated in a hand-held spray gun, which may be used in a manner similar to conventional paint spraying guns. A very high jet velocity (e.g., on the order of 2000 feet per second) is required in such spraying systems to produce a minimum drop size of the matrix metal, such as on the order of about 75 microns diameter. In this respect, fine droplet size of the metal being deposited is highly desirable, since typically the resulting coatings become increasingly more dense with increasingly fine droplet size.

FIG. 15 is an optical micrograph of a composite material simulative of a superconducting composite article. The article shown in the micrograph comprises an array of glass filaments generally parallelly aligned and laterally spaced-apart from one another. The view shown in FIG. 15 is a cross-section, in elevation of such composite material, as reposed on a carrier foil of aluminum. The glass filaments in the array are coated with platinum and disposed in a matrix of aluminum deposited by aluminum plasma spray deposition.

As shown, the noble metal-coated fibers are much more uniformly coated on the spray (upper) side than they are on the carrier foil (lower) side. Infiltration of aluminum between the fibers and the carrier foil is made difficult in this particular instance by the tight lateral spacing of the filaments relative to one another. Infiltration may be significantly improved by wider spacing of the filaments than is shown in FIG. 15.

Alternatively, it may be possible to improve the infiltration of matrix metal in such composite structures by passing the "tape" structure shown in FIG. 15 through a hot press sintering step wherein the tape is exposed to temperatures between the glass transition temperature and the melting point of the matrix metal. Another potential technique for improving the degree of infiltration of matrix metal into a filament array of the type shown in FIG. 15 comprises heating of the deposition substrate to prevent rapid quenching of the matrix metal droplets in the plasma spray field as they impinge on the surface to be coated.

In FIG. 15, the lumpy surface exhibited by the aluminum matrix metal coating is indicative of a large droplet size on the order of 75 microns diameter. In instances where the overall thickness of the tape is on the order of about 200 microns, a smoother surface than that illustrated in FIG. 15 is desirable to achieve optimum mechanical properties, superconductor to matrix metal volume ratios, and physical protection of the superconductor elements. The aforementioned hot pressing procedure may significantly improve surface uniformity and realize such desirable characteristics.

Whenever a metallic coating is applied directly to a 123 MOHTSC material, it is critical that the metal in the applied coating does not scavenge oxygen from the superconductor material. Concurrently, it is important to minimize the interfacial surface resistance between the applied metal coating and the superconductor, by intimate surface contact therebetween. Noble metals such as gold, palladium, platinum, silver, and iridium, particularly when applied by MOCVD application techniques, meet such criteria. These metals conform tightly to the superconducting element surface. They can be applied in highly dense coatings, to provide environmental resistance to deterioration or damage to the superconductor element. They also provide only a small affect on superconducting transition temperature and residual resistivity of the superconducting material.

Figure 16:
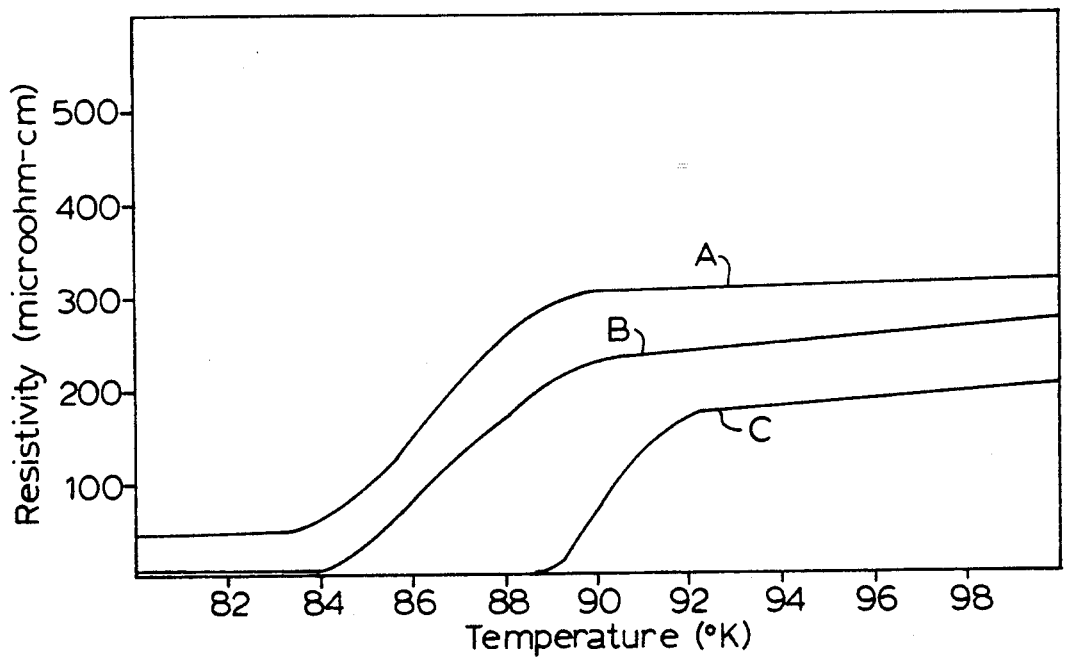
FIG. 16 is a graph of resistivity, in microohm-cm, as a function of temperature, in degrees Kelvin, showing the superconducting transition temperature and residual resistivities of platinum-coated ceramic oxide superconductor filament, and of a corresponding bare fiber of the superconductor.

As an example, platinum-coated 123 MOHTSC filaments were prepared having platinum coating thicknesses ranging from 0 to approximately 400 nanometers for electrical testing for the various fibers tested. Filaments were cut to lengths of 2.5 centimeters (cm) for testing, and resistivity, in microohm-cm, was measured as a function of temperature, in degrees Kelvin. The results of such electrical testing are shown in FIG. 16, where curve A denotes 123 MOHTSC filaments having a platinum coating thereon less than 100 nanometers (nm) in thickness, with curve B representing 123 MOHTSC filaments having a platinum coating thereon of approximately 400 nm thickness. For comparison purposes, curve C represents the corresponding 123 MOHTSC filaments devoid of any platinum coating thereon (virgin bare fibers).

The results shown in FIG. 16 reveal that in general, thicker platinum coatings provided a more distinctive transition, with a significantly lower residual resistivity (curve B) than did corresponding MOHTSC filaments with thinner platinum coatings thereon (curve A).

The data shown in FIG. 16 were based on 12 samples of each type of fiber (A, B, and C), discarding the highest and lowest values. The residual resistivity of the samples tested range from 1.4 to 410 microohm-cm, exclusive of highest and lowest values. These residual resistivity levels give a measure of the resistance of the interface between the noble metal coating and the 123 MOHTSC material. The coated fibers can be conceptually considered to be network of two parallel resistor circuits. One circuit consists solely of the noble metal coating. The other circuit consists of the noble metal/HTSC materials interface at the point where current is introduced, the superconductor itself, and the noble metal/HTSC material interface where the current is extracted. When the contact resistance per unit area is significant with respect to the resistance through the noble metal coating, the region through which current "leaks" into the superconductor from the noble coating becomes large. If this region includes voltage taps, then the voltage will be non-zero even though current is flowing along the path of the superconductor which has no resistance. As a result, a transition which does not go to absolute zero is observed. If the contact resistance is large enough, current will never enter the superconductor and no transition will be observed.

Compared to virgin uncoated fibers of the 123 MOHTSC material (curve C), the coated fibers (curves A and B) show a slight lowering and broadening of the transition range. Such alteration of the transition range characteristics normally is indicative of a slight change in the structure of the 123 MOHTSC material itself, however in this instance it was not clear whether this was due to the noble metal coating itself, or to exposure of the MOHTSC fibers to moisture prior to their coating with platinum. In this respect, it is noted that the virgin bare filaments were stored after their manufacture unknown conditions relative to the conditions to which the filaments later coated with platinum were exposed prior to coating. In any event, the observed change in transition zone for noble metal-coated MOHTSC filaments relative to the virgin uncoated filaments is extremely small in magnitude.

In general, MOCVD coating of noble metal at coating thicknesses on the order of 0.5 micron causes minimal degradation of the superconducting properties of 123 MOHTSC filaments. The noble metal coatings conform well to the rough surface of the 123 MOHTSC filaments, and are of high purity. In the case of platinum as the noble metal species, coating thicknesses of up to 2.5 microns are satisfactorily employed, though it will be appreciated that the specific thickness of the noble or inert metal coating in a given application of the present invention will depend on the specific noble or inert metal species and its method of application, as well as the desired end use properties of the resulting composite article.

Accordingly, suitable noble or inert metal coating thicknesses may readily be determined by those skilled in the art, without undue experimentation In general, MOCVD-applied platinum coatings of at least 0.5 micron thickness produce only a minor decrease (on the order of 3° C.) in the supercritical transition temperature. Measured residual resistivities below the critical transition temperature for platinum-coated MOHTSC filaments as low as the one microohm-cm have been achieved, indicating good surface resistivity character.

The features and advantages of the present invention are more fully illustrated with respect to the following non-limiting examples, wherein all parts and percentages are by weight, unless otherwise expressly stated.

EXAMPLE I

CVD Platinum/Indium/YBCO Composite

Filaments of YBCO (yttrium-barium-copper oxide) MOHTSC material were heated to 300° C. at a vacuum pressure of approximately 1 Torr, using an apparatus of the type schematically shown in FIG. 6 hereof, and coated with platinum, using the specific process conditions tabulated in Table I hereof.

Figure 17:
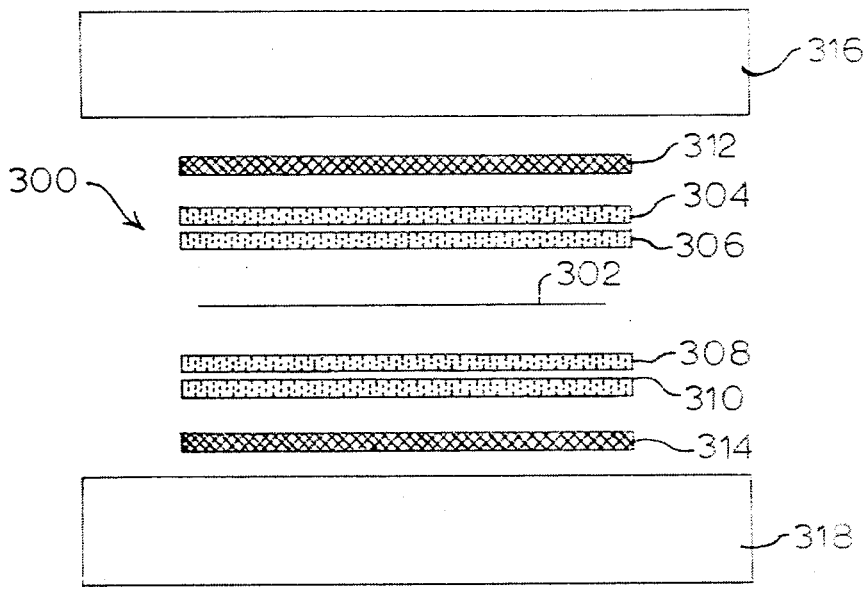
FIG. 17 is a schematic representation of a system for incorporating platinum-coated YBCO superconductor filaments into an indium matrix.

The platinum-coated YBCO filaments were incorporated into an indium matrix, using the process arrangement schematically shown in FIG. 17. In this process system, MOHTSC filaments 302 were deployed in a horizontal plane in laterally spaced relationship to one another, and with each of the filaments parallelly aligned with respect to each other (only the outermost filament is visible in the elevation view of the process system 300 in FIG. 17). The superconductor filaments 302 were arranged between respective layers 304, 306, 308, and 310 of indium foil, each such foil layer having a thickness of 125 microns.

On the top and bottom of this indium foils/MOHTSC filaments array were provided respective layers 312 and 314 of aluminum foil, each such aluminum foil layer having a thickness of 25 microns. The resulting MOHTSC filament/metal foils array was disposed between opposing resistively heated hot-plate members 316 and 318, as shown.

In operation, the filament/foil "sandwich" was compressed between the resistively heated hot-plate members 316 and 318, with the foils being heated to 165° C. at a pressure of 0.16 pound per square inch (psi).

The indium film thickness before pressing was 250 microns, on each side of the filament array. After pressing, the indium film thickness dropped to roughly 10 microns. The aluminum foil thicknesses, however, each remained constant at 25 microns.

In the pressed product article, the infiltration of indium around the YBCO filaments was good. There appeared to be a small amount of separation of the indium from the MOHTSC fibers during the final stages of metallographic polishing. The indium constituent remained fairly soft at room temperature, and was subject to plastic deformation from the forces created by the polishing operation.

Figure 18:
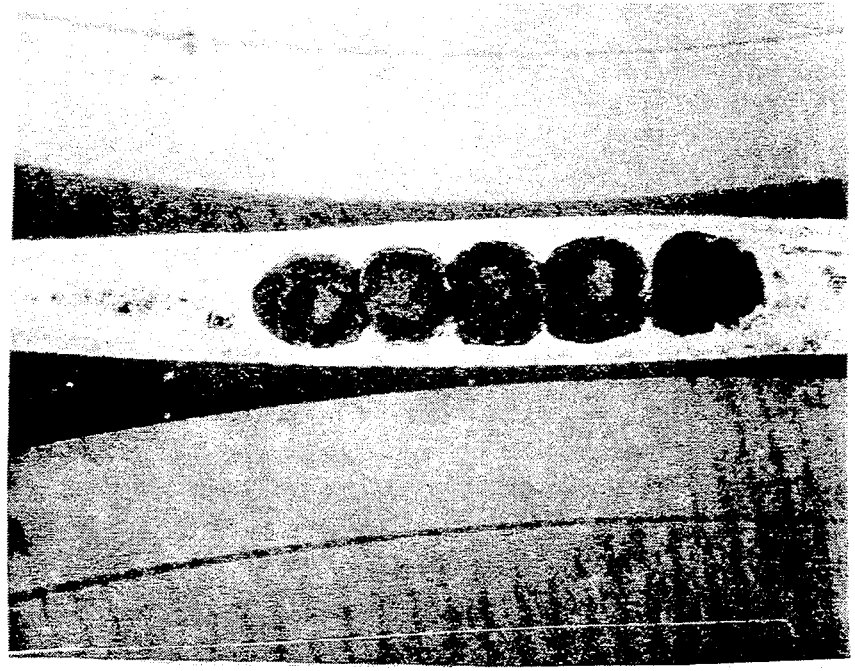
FIG. 18 is a photograph of a composite article formed by the method described with reference to FIG. 17.

Melt coatings from indium and aluminum foils, produced by the process system of FIG. 16, are shown in the enlarged cross-section view of the product composite article in FIG. 18.

Indium has a low tensile strength and a low compressive strength at room temperature (2 to 2.6 MPa), compared to aluminum (485 MPa). For this reason, the indium was embedded in an aluminum foil, to improve the mechanical properties of the composite tape. Indium and aluminum are not readily soluble in each other. Accordingly, it is necessary to activate the aluminum surface, to obtain a strong bond between the facing indium and aluminum surfaces.

The strength and stiffness of composite tapes of the type described above may be varied significantly by appropriate choice of the type and thickness of metal foils employed therein.

Figure 19:
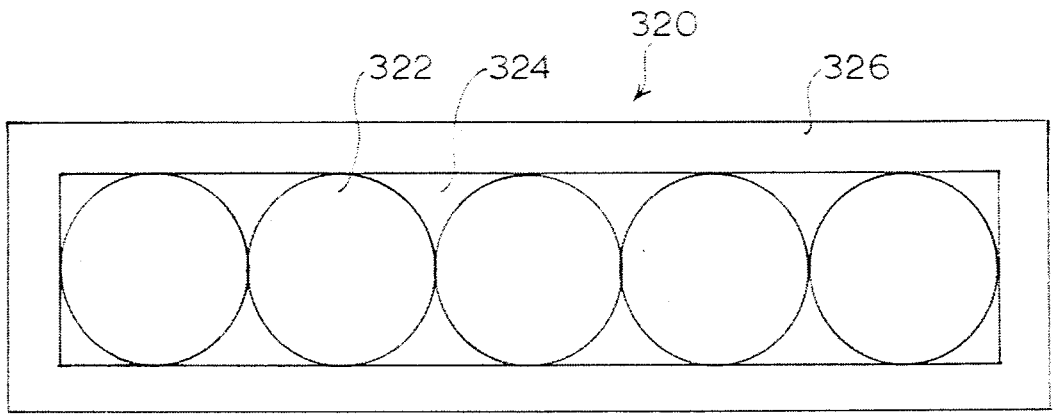
FIG. 19 is an idealized schematic representation of a cross-section of the composite article shown in FIG. 18.

The YBCO/indium/aluminum composite tape shown in FIG. 18 is represented in an idealized schematic form in FIG. 19. As shown in FIG. 19, the composite tape 320 (illustrated in cross-sectional elevational view), comprises a parallelly aligned array of laterally proximate YBCO filaments 322 which is are infiltrated with indium metal 324, and surrounded by a continuous aluminum foil sheath 326.

In this schematically represented, idealized composite, a tape containing five YBCO filaments as shown, with a continuous aluminum foil sheath bounding the composite article, would have a breaking load of 3.54 pounds. Of the total metal cross-sectional area of the cross-section as shown, 75% is composed of continuous aluminum foil, while only 25% is composed of indium. The YBCO fibers occupy 50% of the total cross-sectional area in this idealized representation. The highest net critical current densities in this composite will be achieved by maximizing the packing factor of superconducting fibers. If the aluminum foil thickness is increased to 50 microns, the breaking load would increase to 7.6 pounds, with the YBCO fibers occupying 33% of the total cross-sectional area.

Substituting tin (as an "inert" metal) for indium (as a noble metal) in this tape would increase the breaking load by less than 2%. Accordingly the choice of a primary melt coating for infiltration of the fiber array is more desirably dictated by considerations other than metal species, e.g., chemical bonding and mechanical load transfer considerations.

The foregoing discussion is based on the MOHTSC filaments having a radius of 50 microns, with the aluminum foil thickness being 25 microns. The total area of the superconductor filaments in the cross-section illustrated in FIG. 19 was 0.0393 $mm^2$, the total area of aluminum foil was 0.0325 $mm^2$, and the total area of indium was 0.0107 $mm^2$.

EXAMPLE II

CVD Platinum/Electroplated Copper Composite Article

Electroplated copper, having a tensile strength of approximately 200 Mpa, a resistivity of 1.7 microohm-cm, and a specific gravity of 9, was evaluated as a metal matrix material in superconductor filament tape composites in accordance with the invention. Although copper has a relatively low specific strength (strength/specific gravity) as compared to aluminum, copper has very low electrical resistivity, and may potentially usefully be employed as a matrix metal material in composite applications where room temperature conductivity is critical.

Copper also has the advantage that it can be electrodeposited from numerous electrolytes. Cyanide and pyrophosphate alkalines, and sulfate/fluoroborate acid baths, are the primary electrolytes commonly used in copper plating.

In this Example, a copper fluoroborate bath was utilized to provide a high deposition rate of copper at good thickness levels. Baths of such type can provide thicknesses of deposited metal up to 500 microns, and are simple to prepare, and easy to control.

Plating conditions for a fluoroborate bath typically include a pH of 1, a temperature of about 50° C., and a current density on the order of 0.1 amp per $cm^2$ at 6 volts, using high purity copper annodes.

Platinum was employed as a coating material on the YBCO superconductor fibers in this example for two reasons, viz-a-vis the use of the electroplating process. First, it is necessary to have an electrically conductive coating capable of handling the required current density in the electroplating operation. Second, the YBCO material is effectively protected from the harsh aqueous environment of the plating bath by the platinum coating.

Four inch lengths of glass filaments were employed for demonstration purposes in place of MOHTSC filaments. These glass simulation filaments were coated with a continuous 0.3 micron thick layer of platinum. The resulting platinum-coated glass filaments then were electroplated with copper, using the conditions set out above in this Example.

Figure 20:
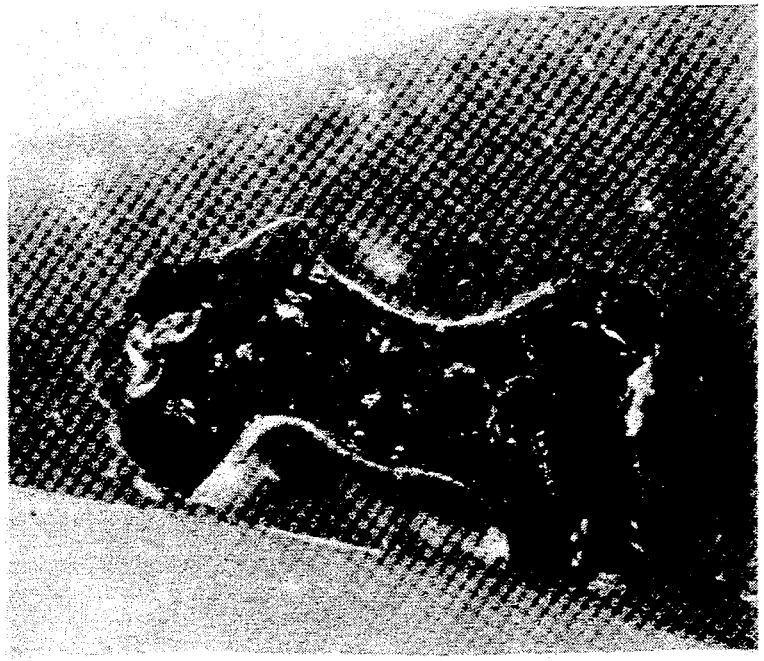
FIG. 20 is a photograph of a cross-section of a composite article comprising platinum-coated glass filaments electroplated with copper.

A cross-section of the resulting electroplated sample is shown in FIG. 20. The filament bundle in this composite was twisted to prevent spreading of filaments in the plating bath, however a small amount of spreading nonetheless occurred. The non-uniformity of the electroplated coating was partially due to the size and arrangement of the sample, and partially was due to the inherent character of electroplating. The metallographic sample showed that the copper infiltrated and adhered well to the platinum-coated filaments, with virtually no internal porosity. Individual plating began on the individual fiber surfaces. As the plating thickness increased, the plating surface boundaries began to intersect and fuse. FIG. 20 shows that these boundaries did in fact fuse, leaving behind no macroscopic voids or observable defect structure. No degradation of the platinum surface (after electroplating) was observed with SEM and EDX analysis.

Adhering the filaments to a metal carrier foil prior to electroplating should provide a significant improvement in plating uniformity. Such a metal foil carrier would fix the filament bundle geometry in a parallel row, similar to the filament array conformation shown in FIG. 18 hereof, and would also provide a uniformly conductive surface, resulting in a more uniform deposition of the electroplated matrix metal. The backside of the foil carrier in such event could be coated with an electrically insulating material, to prevent unwanted plating thereon.

While the invention has been described herein with reference to specific aspects, features, and embodiments, it will be apparent that other variations, modifications, and embodiments are possible, and all such variations, modifications, and embodiments therefore are to be regarded as being within the spirit and scope of the invention.

What is claimed is:

1. A superconducting composite article, comprising a metal oxide high temperature superconductor element coated on an exterior surface thereof with noble or inert metal, wherein the noble or inert metal is non-deleterious to the superconducting properties of the metal oxide high-temperature superconductor element, in a conductive metal matrix comprising non-superconductor, reinforcing fibers in sufficient number and arrangement in the conductive metal matrix to mechanically reinforce same.

2. A superconducting composite article according to claim 1, wherein the noble or inert metal comprises a noble metal selected from the group consisting of gold, palladium, platinum, silver, and iridium.

3. A superconducting composite article according to claim 1, wherein the noble or inert metal comprises platinum.

4. A superconducting composite article according to claim 1, wherein the noble or inert metal comprises gold.

5. A superconducting composite article according to claim 1, wherein the conductive metal matrix comprises a metal selected from the group consisting of aluminum, nickel, copper, indium, tin, tungsten, silver, gold, magnesium, beryllium, tantalum, molybdenum, niobium, chromium, cobalt, iridium, iron, zinc, rhodium, rhenium, and combinations thereof.

6. A superconducting composite article according to claim 1, wherein the conductive metal matrix comprises a metal selected from the group consisting of aluminum and aluminum alloys.

7. A superconducting composite article according to claim 1, wherein the noble or inert metal is platinum, and the conductive metal matrix is selected from the group consisting of aluminum and aluminum alloys.

8. A superconducting composite article according to claim 1, wherein the metal oxide high temperature superconductor element comprises at least one metal oxide high temperature superconductor fiber.

9. A superconducting composite article according to claim 1, wherein the metal oxide high temperature superconductor element comprises an array of discrete metal oxide high temperature superconductor fibers each coated with a noble metal coating, and wherein the array of nobel metal-coated metal oxide high temperature superconductor fibers is disposed in a unitary conductive metal matrix, thereby forming a fiber/matrix composite.

10. A superconducting composite article according to claim 9, wherein the array of noble metal-coated metal oxide high temperature superconductor fibers comprises fibers which are parallelly longitudinally aligned with one another and transversely adjacent one another in a generally planar fiber array, and wherein the composite article is in the form of a tape.

11. A superconducting composite article according to claim 1, wherein the metal oxide high temperature superconductor element comprises a metal oxide high temperature superconductor fiber, and the conductive metal matrix is formed on the noble or inert metal coating as an overlying cladding thereon.

12. A superconductive composite article according to claim 1, further comprising a conductive foil support on which is disposed the metal oxide high temperature superconductor element coated with noble or inert metal in the conductive metal matrix.

13. A superconducting composite article according to claim 1, wherein the metal oxide high temperature superconductor element comprises a plurality of metal oxide high temperature superconductor fibers, each coated on its exterior surface with noble or inert metal and overcoated with a cladding or said conductive matrix metal, with the plural metal oxide high temperature superconductor fibers being in close-packed array and parallelly longitudinal aligned with respect to one another.

14. A superconducting composite article according to claim 1, comprising a plurality of noble or inert metal-coated and matrix metal-clad metal oxide high temperature superconductor fibers, which are spatially related to one another in a composite structure such that electromagnetic fields of the noble or inert metal-coated, matrix metal-clad metal oxide high temperature superconductor fibers are not canceled by one another.

15. A superconducting composite article according to claim 1, wherein the metal oxide high temperature superconductor element comprises a 123 metal oxide high temperature superconductor material.

16. A superconducting composite article according to claim 1, wherein the metal oxide high temperature superconductor element comprises a ceramic copper oxide superconductor.

17. A superconducting composite article according to claim 1, wherein the metal oxide high temperature superconductor element comprises an yttrium-barium-copper oxide superconductor.

18. A superconducting composite article according to claim 1, wherein the metal oxide high temperature superconductor element comprises a superconductive material of the formula $RBa_2Cu_3O_{7-x}$, wherein R is yttrium or another lanthanide rare earth, and x is a number from 0 to 1.

19. A superconducting composite article according to claim 1, wherein the metal oxide high temperature superconductor element is formed of a superconductive material of the formula $R_1M_2Cu_3O_x$ wherein R is selected from Y, Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, wherein M is selected from the group consisting of Ba, Sr-Ca, Ba-Sr, and Ba-Ca, and wherein x is a number of from about 6.0 to about 7.1.

20. A superconducting composite article according to claim 1, wherein the metal oxide high temperature superconductor element is formed of a metal oxide high temperature superconductor material of the formula $YBa_2Cu_3O_x$, wherein x is a number of from about 6.4 to about 7.1.

21. A superconducting composite article according to claim 1, wherein the metal oxide high temperature superconductor element is formed of a high temperature superconductor material of the formula $(AO)_mM_2G_{n-1}Cu_mO_{2n+2}$, wherein A is selected from Tl, Pb, and Bi, or a mixture of such elements; m=1 or 2, with a proviso that m=2 only when A is Bi; n is an integer having a value of from 1 to 5; M is Ba or Sr; and G is selected from Ca and Sr.

22. A superconducting composite article according to claim 1, wherein the metal oxide high temperature superconductor element consists essentially of a YBaCuO superconductor.

23. A superconducting composite article according to claim 1, wherein the metal oxide high temperature superconductor element comprises a BiSrCaCuO superconductor.

24. A superconducting composite article according to claim 1, wherein the metal oxide high temperature superconductor element comprises a TlBaCaCuO superconductor.

25. A superconducting composite article according to claim 1, wherein the non-superconductor, reinforcing fibers are selected from the group consisting of glass fibers, graphite fibers, aramid fibers, and combination thereof.

* * * * *